United States Patent
Mallory et al.

(10) Patent No.: US 6,847,230 B2
(45) Date of Patent: Jan. 25, 2005

(54) INFORMATION HANDLING SYSTEM FEATURING A BJT-BASED BI-DIRECTIONAL LEVEL TRANSLATOR

(75) Inventors: Joseph D. Mallory, Cedar Park, TX (US); Nikolai V. Vyssotski, Elgin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 10/379,237

(22) Filed: Mar. 4, 2003

(65) Prior Publication Data

US 2004/0174188 A1 Sep. 9, 2004

(51) Int. Cl.[7] .......................................... H03K 19/0175
(52) U.S. Cl. ............................... 326/80; 326/68; 326/82
(58) Field of Search ............................. 326/63, 68, 86, 326/80, 82, 83, 90

(56) References Cited

U.S. PATENT DOCUMENTS

| | | | |
|---|---|---|---|
| 4,578,602 A | 3/1986 | West et al. | |
| 4,825,108 A | 4/1989 | Burton et al. | |
| 5,101,123 A | 3/1992 | Ten Eyck | |
| 5,680,063 A | * 10/1997 | Ludwig et al. | 326/80 |
| 5,852,367 A | 12/1998 | Boerstler et al. | |
| 5,877,633 A | * 3/1999 | Ng et al. | 326/80 |
| 6,046,605 A | * 4/2000 | Ziemkowski et al. | 326/86 |
| 6,154,057 A | * 11/2000 | Shao et al. | 326/63 |
| 6,373,284 B1 | * 4/2002 | Delage et al. | 326/80 |
| 6,522,169 B2 | * 2/2003 | Anderson et al. | 326/82 |

\* cited by examiner

*Primary Examiner*—Michael Tokar
*Assistant Examiner*—Linh Van Nguyen
(74) *Attorney, Agent, or Firm*—Haynes and Boone, LLP

(57) ABSTRACT

A method of implementing bi-directional level translation in an information handling system includes coupling a first device port via a first resistor to a first voltage. A second device port is coupled via a second resistor to a second voltage different from the first voltage. Lastly, a single bipolar junction transistor (BJT) couples the first device port to the second device port, the single bipolar junction transistor including an emitter coupled to the first device port, a base coupled via a third resistor to the first voltage, and a collector coupled to the second device port, wherein the bipolar junction transistor operates as a bi-directional level translator between the first and second device ports.

19 Claims, 1 Drawing Sheet

INFORMATION HANDLING SYSTEM FEATURING A BJT-BASED BI-DIRECTIONAL LEVEL TRANSLATOR

BACKGROUND

The present disclosure relates generally to information handling systems, and more particularly to an information handling system featuring a BJT-based bi-directional level translator.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

In conjunction with information handling systems, there are multiple chipsets and subsystems powered off multiple power rails with different voltage levels. Often a design engineer is faced with a task of interfacing subsystems signaling at different voltage levels (such as System Messaging Bus (SMB) level conversion). Typically to accomplish this task, voltage translator circuits based on Metal Oxide Field Effect Transistors (MOSFETs) are used. However, at lower signaling voltages, the problem becomes more difficult to resolve due to the lack of inexpensive MOSFETs with low gate threshold voltages (Vgs).

MOSFETs have traditionally been used to translate voltages from 2.5 V to 5 V. They easily lend themselves to these applications due to the indifference of MOSFETs to the direction of current in its conducting channel. In other words, a signal can propagate in either direction, forward or reverse. FIG. 1 illustrates a schematic diagram view for a typical MOSFET-based voltage translator 10. However, as signaling voltages drop lower than 2.0 V, the typical MOSFET-based voltage translator circuit can no longer work reliably due to a minimum Vgs voltage required to maintain the conducting channel in the MOSFET. Unfortunately, due to the manufacturing process limitations, discrete MOSFETs with lower than 1.5 V Vgs are difficult to produce at reasonable costs.

Accordingly, it would be desirable to provide method and apparatus providing level translation in an information handling system absent the disadvantages found in the prior methods discussed above.

SUMMARY

According to one embodiment, a method of implementing bi-directional level translation in an information handling system includes coupling a first device port via a first resistor to a first voltage. A second device port is coupled via a second resistor to a second voltage different from the first voltage. Lastly, a single bipolar junction transistor (BJT) couples the first device port to the second device port, the single bipolar junction transistor including an emitter coupled to the first device port, a base coupled via a third resistor to the first voltage, and a collector coupled to the second device port, wherein the bipolar junction transistor operates as a bi-directional level translator between the first and second device ports.

DETAILED DESCRIPTION

According to one embodiment of the present disclosure, a method and system apparatus are disclosed for implementing a BJT-based bi-directional level translator in an information handling system. The method and system can be better understood by reference to the flow charts, drawing figures, and additional discussion included herein.

Figure 1:
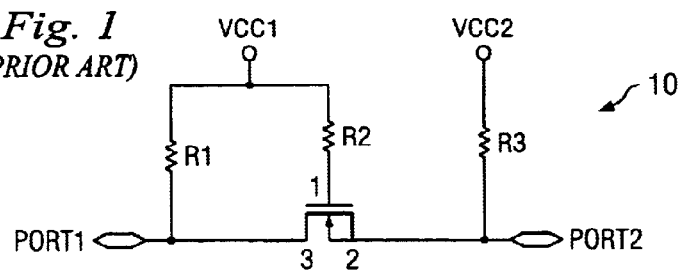
FIG. 1 illustrates an electrical schematic diagram view of a field effect transistor based bidirectional level translator known in the art.
Figure 2:
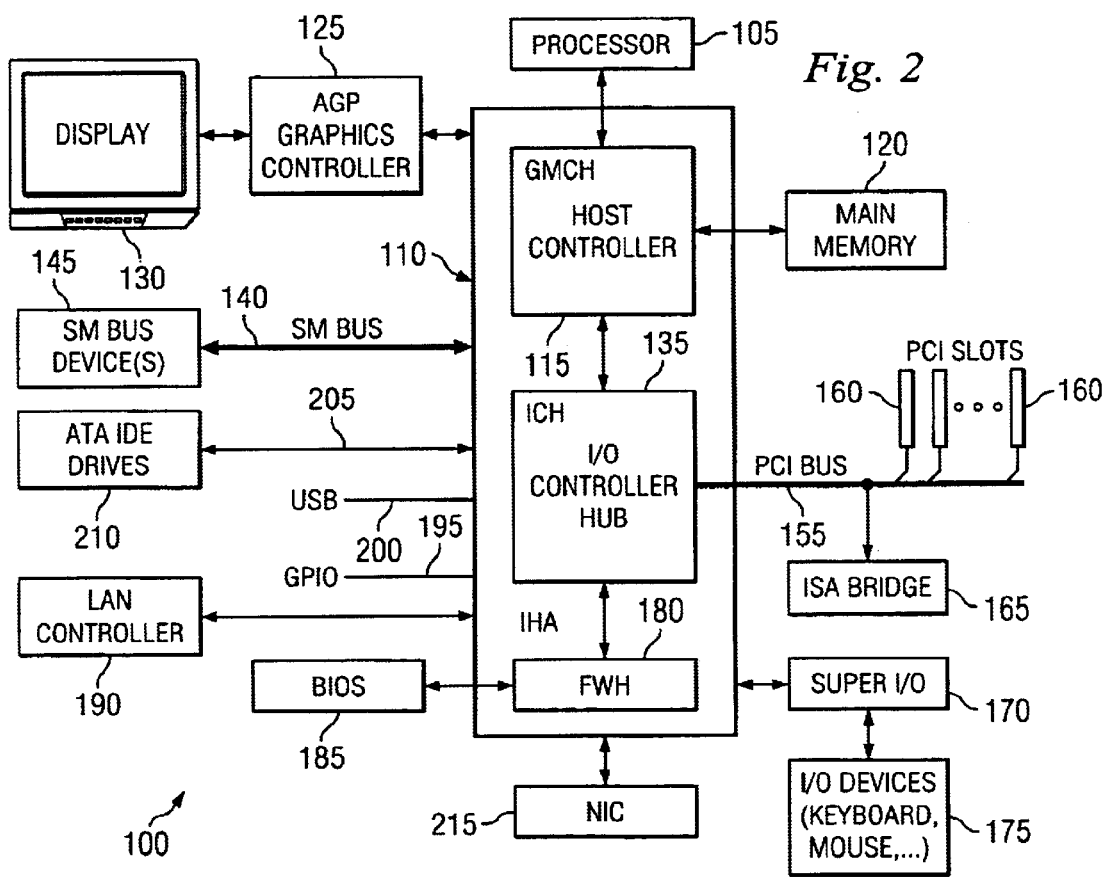
FIG. 2 illustrates a block diagram view of an information handling system featuring a BJT-based bi-directional level translator according to an embodiment of the present disclosure.

FIG. 2 depicts a high level block diagram of an information handling system 100 in which the disclosed technology is practiced. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

The particular information handling system 100 depicted in FIG. 2 is a portable computer which includes a processor 105. An Intel Hub Architecture (IHA) chip 110 provides system 100 with memory and I/O functions. More particularly, IHA chip 110 includes a Graphics and AGP Memory Controller Hub (GMCH) 115. GMCH 115 acts as a host controller that communicates with processor 105 and further acts as a controller for main memory 120. GMCH 115 also provides an interface to Advanced Graphics Port (AGP) controller 125 which is coupled thereto. A display 130 is coupled to AGP controller 125. IHA chip 110 further includes an I/O Controller Hub (ICH) 135 which performs numerous I/O functions. ICH 135 is coupled to a System Management Bus (SM Bus) 140 which is coupled to one or more SM Bus devices 145.

ICH 135 is coupled to a Peripheral Component Interconnect (PCI) bus 155 which is coupled to mini PCI connector slots 160 which provide expansion capability to portable computer 100. A super I/O controller 170 is coupled to ICH 135 to provide connectivity to input devices such as a keyboard and mouse 175 as shown in FIG. 2. A firmware hub (FWH) 180 is coupled to ICH 135 to provide an interface to system BIOS 185 which is coupled to FWH 180. A General Purpose I/O (GPIO) bus 195 is coupled to ICH 135. USB ports 200 are coupled to ICH 135 as shown. USB devices such as printers, scanners, joysticks, etc. can be added to the system configuration on this bus. An integrated drive electronics (IDE) bus 205 is coupled to ICH 135 to connect IDE drives 210 to the computer system. System 100 may further include a network interface card (NIC) 215.

Figure 3:
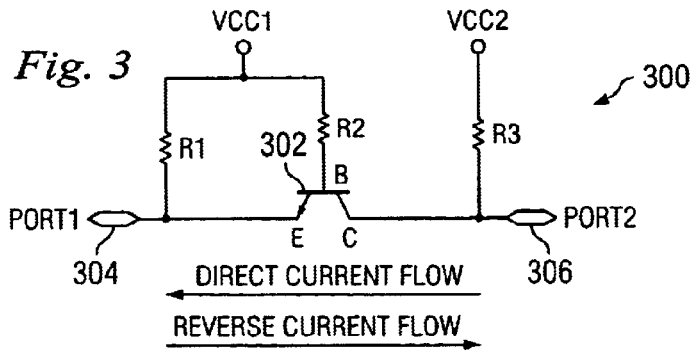
FIG. 3 illustrates an electrical schematic diagram view of a BJT-based bi-directional level translator according to an embodiment of the present disclosure.

Referring now to FIG. 3, the BJT-based bi-directional level translator 300 according to an embodiment of the present disclosure will be discussed in further detail. Bipolar Junction Transistors (BJTs) are current controlled devices as opposed to voltage-controlled devices, that is, MOSFETs. As long as the appropriate base current is maintained, a BJT will be able to conduct collector current at very low controlling base-emitter voltage. Typically, the base emitter voltage is on the order of 0.6 V. However, a drawback of BJTs preventing them from being used in level translators in the past is the sensitivity of BJTs to the direction of current between emitter and collector terminals. Typical applications of BJTs always assume that the BJTs will conduct collector current in one direction only.

In practice, however, for certain types of BJTs, it is possible to build a bi-directional level translating circuit 300 using unconventional reverse conduction characteristics of BJT 302. The BJT translator circuit as shown in FIG. 3 is an example of such circuit. When a logical zero (0) is asserted on the PORT1 side 304, the BJT 302 operates as expected with base-emitter current controlling collector current. A low emitter potential causes the base-emitter junction to be forward biased, allowing conduction of collector current determined by resistor R3 and a current gain coefficient of the transistor 302. The current gain coefficient of the transistor is referred to as the Beta ($\beta$) of the transistor. In turn, collector current causes a voltage drop across R3, resulting in a voltage on PORT2 306 to be recognized as a logical zero (0).

However, when a logical zero (0) is asserted on the PORT2 side 306, the BJT 302 operates in a reverse conduction mode. In the reverse conduction mode, the base-collector junction performs functions of a base-emitter junction controlling the emitter current, instead of the collector current as in the conventional case. The magnitude of the emitter current is set by pull-up resistor R1 and a reverse current gain coefficient of the transistor (i.e., reverse Beta).

According to one embodiment, the types of BJTs suitable for use in the circuit 300 of FIG. 3 are include BJTs having relatively high reverse Beta, on the order of 10 and above. This can be achieved by selecting basic low-cost BJTs without additional silicone doping used to enhance switching characteristics, such as gold doping. Examples of such transistors include Fairchild part MMBT 100.

Resistor values R1 and R3 are selected based on the load impedances and load capacitances, as well as, the rise times required on PORT1 304 and PORT2 306. Once selected, R1 and R3 will set emitter and collector currents. Resistor R2 value is selected based on the emitter current, VCC1, Vbc, Vil_max [[What does Vil_max stand for?—Voltage at maximum current input?]] on PORT2, Vol_max [[What does Vol_max stand for?—Voltage at maximum current output?]] on PORT1 and reverse Beta at the lowest operational temperature. Because the base-collector junction is more susceptible to avalanche breakdown, it is preferable to connect PORT2 to the part of the circuit where an electrostatic discharge (ESD) event is more likely to occur (e.g., a VGA connector).

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A method of implementing bi-directional level translation in an information handling system, said method comprising:

coupling a first device port to the system via a first resistor to a first voltage;

coupling a second device port to the system via a second resistor to a second voltage different from the first voltage;

coupling the first device port to the second device port via a single bipolar junction transistor (BJT), the single bipolar junction transistor includes an emitter coupled to the first device port, a base coupled via a third resistor to the first voltage, and a collector coupled to the second device port, wherein the bipolar junction transistor operates as a bi-directional level translator between the first and second device ports; and selecting the first resistor and the second resistor values based upon load impedances and load capacitances, as well as, rise times required on the first device port and the second device port, wherein the third resistor value is selected as a function of the emitter current, VCC1, Vbc, Vil_max on the second port, and Vol_max on the first device port and a reverse Beta of the BJT at the lowest operational temperature.

2. The method of claim 1, wherein the first voltage is on the order of 1.5 volts and the second voltage is on the order of 3.3 volts.

3. The method of claim 1, wherein asserting a logical zero (0) on the first device port causes the BJT to operate with a base-emitter current controlling a collector current, and wherein a low emitter potential causes the base-emitter junction to be forward biased, allowing conduction of the collector current determined by the second resistor and a current gain coefficient of the BJT, further wherein the collector current causes a voltage drop across the second resistor, resulting in a voltage on the second device port to be recognized as a logical zero (0).

4. The method of claim 1, wherein asserting a logical zero (0) on the second device port causes the BJT to operate in a reverse conduction mode, wherein a base-collector junction of the BJT controls an emitter current and wherein a magnitude of the emitter current is established as a function of the first resistor and a reverse current gain coefficient of the BJT.

5. The method of claim 1, wherein the BJT includes a relatively high reverse Beta.

6. The method of claim 5, wherein the reverse Beta is on the order of 10 and above.

7. The method of claim 5, wherein the BJT includes a basic low-cost BJT without additional silicone doping used to enhance switching characteristics.

8. The method of claim 1, further wherein once selected, the first and second resistors set emitter and collector currents.

9. The method of claim 1, further comprising coupling the second device port to a portion of a circuit in the information handling system in which an electrostatic discharge (ESD) event is more likely to occur.

10. The method of claim 9, wherein the portion of the circuit includes a VGA connector.

11. An information handling system implementing bi-directional level translation comprising:
- a microprocessor;
- a storage coupled to the microprocessor;
- a plurality of ports coupled to the system;
- a first device port couple via a first resistor to a first voltage;
- a second second device port coupled via a second resistor to a second voltage different from the first voltage; and
- a single bipolar junction transistor (BJT) coupling the first device port to the second device port, said single bipolar junction transistor including an emitter coupled to the first device port, a base coupled via a third resistor to the first voltage, and a collector coupled to the second device port, wherein said bipolar junction transistor operates as a bi-directional level translator between the first and second device ports, wherein the first and second resistor values are selected based upon load impedances and load capacitances, as well as, rise times required on said first device port and said second device port and wherein the third resistor value is selected as a function of the emitter current, VCC1, Vbc, Vil_max on said second port, and Vol_max on said first device port and a reverse Beta of the BJT at the lowest operational temperature.

12. The system of claim 11, wherein the first voltage is on the order of 1.5 volts and the second voltage is on the order of 3.3 volts.

13. The system of claim 11, wherein asserting a logical zero (0) on said first device port causes said BJT to operate with a base-emitter current controlling a collector current, and wherein a low emitter potential causes the base-emitter junction to be forward biased, allowing conduction of the collector current determined by the second resistor and a current gain coefficient of said BJT, further wherein the collector current causes a voltage drop across the second resistor, resulting in a voltage on said second device port to be recognized as a logical zero (0).

14. The system of claim 11, wherein asserting a logical zero (0) on said second device port causes said BJT to operate in a reverse conduction mode, wherein a base-collector junction of said BJT controls an emitter current and wherein a magnitude of the emitter current is established as a function of the first resistor and a reverse current gain coefficient of said BJT.

15. The system of claim 11, wherein said BJT includes a relatively high reverse Beta.

16. The system of claim 15, wherein the reverse Beta is on the order of 10 and above.

17. The system of claim 15, wherein said BJT includes a basic low-cost BJT without additional silicone doping used to enhance switching characteristics.

18. The system of claim 11, wherein said second device port is coupled to a portion of a circuit in the information handling system having a high probability that an electrostatic discharge (ESD) event is likely to occur.

19. A computer system comprising:
- a microprocessor;
- a storage coupled to the microprocessor;
- a display coupled to the system;
- a plurality of ports coupled to the system;
- a first device port coupled via a first resistor to a first voltage;
- a second second device port coupled via a second resistor to a second voltage different from the first voltage;
- a single bipolar junction transistor (BJT) coupling the first device port to the second device port, said single bipolar junction transistor including an emitter coupled to the first device port, a base coupled via a third resistor to the first voltage, and a collector coupled to the second device port, wherein said bipolar junction transistor operates as a bi-directional level translator between the first and second device ports; and
- selecting the first resistor and the second resistor values based upon load impedances and load capacitances, as well as, rise times required on the first device port and the second device port, wherein the third resistor value is selected as a function of the emitter current, VCC1, Vbc, Vil_max on the second port, and Vol_max on the first device port and a reverse Beta of the BJT at the lowest operational temperature.

* * * * *